United States Patent
Xu et al.

(10) Patent No.: US 11,755,794 B1
(45) Date of Patent: Sep. 12, 2023

(54) SOIL-ROCK FAULT SIMULATION DEVICE

(71) Applicant: JIANGHAN UNIVERSITY, Wuhan (CN)

(72) Inventors: Longjun Xu, Wuhan (CN); Haoyu Wu, Wuhan (CN); Shibin Lin, Wuhan (CN); Guochen Zhao, Wuhan (CN); Qinghui Lai, Wuhan (CN); Qihan Xu, Wuhan (CN); Lili Xie, Wuhan (CN)

(73) Assignee: JIANGHAN UNIVERSITY, Wuhan (CN)

( * ) Notice: Subject to any disclaimer, the term of this patent is extended or adjusted under 35 U.S.C. 154(b) by 0 days.

(21) Appl. No.: 18/190,271

(22) Filed: Mar. 27, 2023

(51) Int. Cl.
G06F 30/20 (2020.01)
G01M 7/02 (2006.01)

(52) U.S. Cl.
CPC ............ *G06F 30/20* (2020.01); *G01M 7/027* (2013.01)

(58) Field of Classification Search
CPC .............................. G06F 30/20; G01M 7/027
USPC ............................................................. 703/6
See application file for complete search history.

(56) References Cited

U.S. PATENT DOCUMENTS

| | | | |
|---|---|---|---|
| 11,085,859 B1 * | 8/2021 | Zou .......................... | E21D 9/00 |
| 2009/0297273 A1 * | 12/2009 | Lindbergh ............... | G01P 3/22 |
| | | | 702/9 |
| 2021/0049933 A1 * | 2/2021 | Chen ...................... | G09B 23/40 |

FOREIGN PATENT DOCUMENTS

| CN | 207937287 U | 10/2018 |
|---|---|---|
| CN | 110258668 A | 9/2019 |
| CN | 113215864 A | 8/2021 |

* cited by examiner

*Primary Examiner* — Andre Pierre Louis
(74) *Attorney, Agent, or Firm* — Nitin Kaushik

(57) ABSTRACT

The present application provides a soil-rock fault simulation device, comprising a base, a support arm, a first box body and a second box body; the first box body is movably mounted on the support arm and moves in a left and right direction to facilitate the movement of the first box body relative to the second box body in the left and right direction; the first box body moves in a forward and backward direction relative to the second box body as the support arm moves in a forward and backward direction relative to the base, and the first soil-rock in the first soil-rock space forms a forward-backward direction fault as the first box body moves in a forward and backward direction relative to the second box body; the fault simulation effect of soil-rock fault simulation device is improved.

6 Claims, 3 Drawing Sheets

US 11,755,794 B1

SOIL-ROCK FAULT SIMULATION DEVICE

CROSS-REFERENCE TO RELATED APPLICATIONS

The application claims priority to Chinese patent application No. 202211043404X, filed on Mar. 28, 2022, the entire contents of which are incorporated herein by reference.

TECHNICAL FIELD

The present application relates to the technical field of a seismic fault simulation device, and particularly relates to a soil-rock fault simulation device.

BACKGROUND

With the development of science and technology and engineering construction in China, earthquake (soil-rock) fault simulation device has been gradually applied in scientific research and campus teaching. In practical situations, the relative movement of the soil-rock fault has multiple directions, such as left and right direction, forward and backward direction, and up and down direction, and even more complex combination conditions. However, the existing soil-rock fault simulation device can simulate a single fault direction, and the existing soil-rock fault simulation device comprises left and right soil-rock blocks to simulate seismic plans, and the soil-rock fault in a corresponding direction is simulated by relative movement of the left and right soil-rock blocks separately in a certain direction, and a more complex soil-rock fault cannot be presented, resulting in that the fault simulation effect of the existing soil-rock fault simulation device is lack of functional diversity.

SUMMARY

The embodiments of the present application provide a soil-rock fault simulation device to solve the problem that the fault simulation effect of the existing soil-rock fault simulation device is poor.

In the first aspect, embodiments of the present application provide a soil-rock fault simulation device, comprising:

a base:

a support arm movably mounted to the base and moving in a forward and backward direction;

a first box body movably mounted on the support arm and moving in a left and right direction; the first box body provided with a first accommodating cavity;

a second box body provided on one side of the first box body and mounted on the base; wherein the second box body is provided with a second accommodating cavity, the second accommodating cavity is provided in the first accommodating cavity, and communicated with the first accommodating cavity in a left and right direction so that a first soil-rock space is formed between the second accommodating cavity and the first accommodating cavity, and the first soil-rock space is used for storing the first soil-rock; the first soil-rock in the first soil-rock space forms a fault as the first box body moves relative to the second box body.

Optionally, a first cylinder and a first linear guide rail are provided between the first box body and the support arm, the first cylinder and the first linear guide rail are both arranged in a left and right direction, and a fixed end of the first linear guide rail is connected to the support arm, and a moving end is connected to the bottom of the first box body; the first cylinder is fixedly connected to the support arm, and an output end is connected to a side wall of the first box body.

Optionally, the base is provided with a moving groove, and the moving groove extends in a forward and backward direction; the lower side wall of the support arm is provided with a moving portion, and the moving portion is inserted into the moving groove and can move in the forward and backward direction;

a second cylinder is connected to the support arm, a fixed end of the second cylinder is connected to the base, and an output end is connected to the support arm, and drives the support arm and the first box body on the support arm to move in a forward and backward direction.

Optionally, the moving groove is a circular arc groove, and the opening of the moving groove extends upwards; the moving is a circular arc portion that is inserted into the circular arc groove and can move up and down relative to the circular are groove.

Optionally, the base is connected to a third cylinder, and the third cylinder is arranged at the bottom of the support arm;

the third cylinder is arranged vertically, a fixed end of the third cylinder is connected to the base, and an output end of the third cylinder abuts the bottom of the support arm and drives the support arm to move up and down relative to the base so that the first box body moves up and down relative to the second box body.

Optionally, the soil-rock fault simulation device is further provided with a third box body, the third box body and the second box body being located at the left end and the right end of the support arm; the third box body is provided with a third accommodating cavity, and the third accommodating cavity is used for accommodating a second soil-rock.

Optionally, the soil-rock fault simulation device is further provided with a fourth box body, the fourth box body is provided at the base and one side of the third box body, the fourth box body is provided with a fourth accommodating cavity, the fourth accommodating cavity communicating with the third accommodating cavity in the left and right direction and forms a second soil-rock space with the third accommodating cavity, the second soil-rock space is used for storing the second soil-rock.

Optionally, the second accommodating cavity is convexly provided with a second circular arc plate at the opening in the left and right direction, the second circular are plate extends arc-shaped in the forward and backward direction; and the first accommodating cavity is convexly provided with a first circular arc plate at the opening in the left and right direction, and the first circular arc plate and the second circular arc plate are in circular abutment and have a movable gap.

Optionally, the second circular arc plate extends arcuately towards the first box body, and the length of the circular arc of the second circular arc plate is greater than the length of the circular arc of the first circular arc plate.

Optionally, the second box body is movably mounted to the base and moves relative to the base as the first box body moves, the second box body moves in a forward and backward direction relative to the base.

A soil-rock fault simulation device provided in an embodiment of the present application, wherein a support arm is movably mounted on a base and moves in a forward and backward direction; the first box body is movably mounted on the support arm and moves in a left and right direction; the first box body is provided with a first accommodating cavity; the second box body is arranged at one side of the first box body and is mounted on the base; the second box body is provided with a second accommodating cavity, the second accommodating cavity is provided in the first accommodating cavity, and communicates with the first accommodating cavity in the left and right direction, so that a first soil-rock space is formed between the second accommodating cavity and the first accommodating cavity, and the first soil-rock space is used for storing the first soil-rock; at this time, the first box body is movably mounted on the support arm and moves in a left and right direction to facilitate the movement of the first box body relative to the second box body in the left and right direction, and the first soil-rock in the first soil-rock space forms a left-right direction fault as the first box body moves left and right relative to the second box body; the first box body moves forward and backward relative to the second box body as the support arm moves forward and backward relative to the base, and the first soil-rock in the first soil-rock space forms a forward-backward direction fault as the first box body moves forward and backward relative to the second box body; the first box body moves up and down relative to the second box body as the support arm moves up and down relative to the base; the first soil-rock in the first soil-rock space forms up and down direction fault as the first box body moves up and down relative to the second box body, so as to form left-right direction faults, forward-backward direction faults and up-down direction faults of the first soil-rock based on the relative movement of the first box body and the second box body, so as to be able to simulate the left-right direction faults, forward-backward direction faults and up-down direction faults of the first soil-rock in the soil-rock fault simulation device; the fault simulation effect of soil-rock fault simulation device is improved, and simulations of multiple directional faults are integrated.

BRIEF DESCRIPTION OF DRAWINGS

In order that the manner in which the embodiments of the present are described herein can be understood, a brief description of the drawings that accompany the detailed description can be briefly described as follows. It is obvious that the drawings in the following description are merely some embodiments of the present application, and it would have been obvious for a person skilled in the art to obtain other drawings according to these drawings without involving any inventive effort.

For a more complete understanding of the present application and its advantages, reference is now made to the following descriptions taken in conjunction with the accompanying drawings. In the following description, the same reference numerals denote the same parts.

DETAILED DESCRIPTION OF THE EMBODIMENTS

The technical solutions in the embodiments of the present application will be clearly and completely described below with reference to the drawings in the embodiments of the present application. Obviously, the embodiments described are only a few, but not all, embodiments of the present application. Based on the embodiments of the present application, all other embodiments obtained by a person skilled in the art without involving any inventive effort are within the scope of the present application.

The embodiments of the present application provide a soil-rock fault simulation device to solve the problem that the fault simulation effect of the existing soil-rock fault simulation device is poor.

Figure 1:
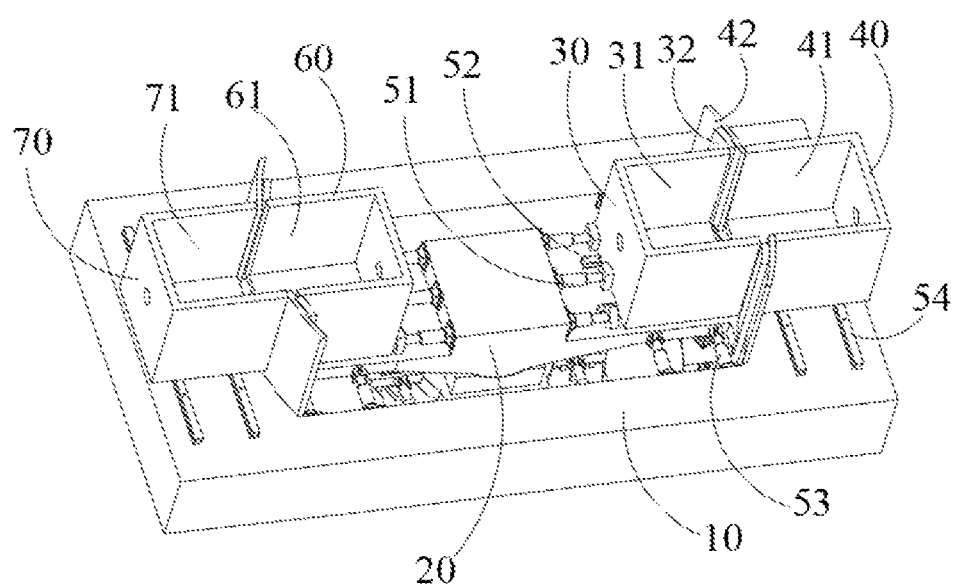
FIG. 1 is a perspective view of a soil-rock fault simulation device provided in an embodiment of the present application.
Figure 2:
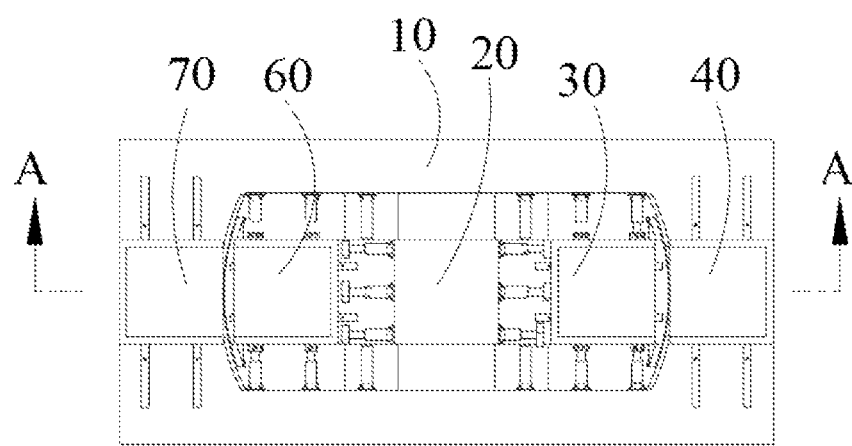
FIG. 2 is a top view of a soil-rock fault simulation device provided in an embodiment of the present application.
Figure 3:
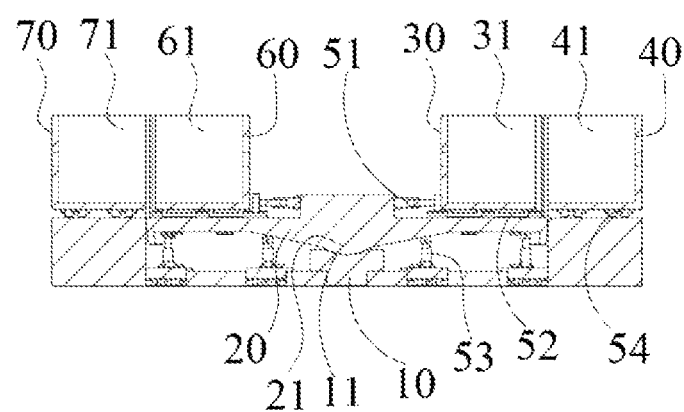
FIG. 3 is a sectional view taken along line A in FIG. 2.

Referring to FIGS. 1 to 3, an embodiment of the present application provides a soil-rock fault simulation device comprising a base 10, a support arm 20, a first box body 30, and a second box 40, the base 10 serving as a support member of the soil-rock fault simulation device, to support the support arm 20, the first box body 30 and the second box body 40.

The support arm 20 is movably mounted to the base 10 and moves in the forward and backward direction, wherein the base 10 is provided with a moving groove 11 extending in the forward and backward direction.

Alternatively, the moving groove 11 is a circular arc groove, and an opening of the moving groove 11 extends upward.

The lower side wall of the support arm 20 is provided with a moving portion 21, the moving portion 21 is inserted into the moving groove 11 and can move in the forward and backward direction. In this case, the moving portion 21 is a circular arc portion, which is inserted into the circular arc groove, can move in the forward and backward extension direction of the circular arc groove and can swing relative to the circular arc groove.

Since the moving groove 11 is a circular arc groove, and the moving portion 21 is a circular arc portion, the outer peripheral surface of the circular arc portion and the inner peripheral surface of the circular arc groove is arc-shaped connected, and can move relative to the arc shape, so that the moving portion 21 swings relative to the moving groove 11, thereby realizing the up-down direction movement of the support arm 20 relative to the base 10, and further realizing the forward-backward direction movement and the up-down direction movement of the support arm 20 relative to the base 10.

Since the first box body 30 is mounted to the support arm 20 and moves along with the movement of the support arm 20, the forward-backward direction movement and the up-down direction movement of the first box body 30 relative to the base 10 are achieved.

In addition, the first box body 30 is movably mounted to the support arm 20 and moves in a left and right direction, and at this time, a first cylinder 51 and a first linear guide rail 52 are provided between the first box body 30 and the support arm 20.

The first cylinder 51 and the first linear guide rail 52 are both arranged in a left and right direction, the fixed end of the first linear guide rail 52 is connected to the support arm 20, and the moving end is connected to the bottom of the first box body 30; the first cylinder 51 is fixedly connected to the support arm 20, and the output end is connected to the side wall of the first box body 30. At this time, the first box body 30 is guided to move relative to the support arm 20 in the left and right direction via the first linear guide rail 52, and the output end of the first cylinder 51 is connected to the side wall of the first box body 30 and serves as a power source for moving the first box body 30 in the left and right direction, driving the first box body 30 to move in the horizontal direction.

The first box body 30 is provided with a first accommodating cavity 31 for accommodating the first soil-rock. Alternatively, the first accommodating cavity 31 is provided with an opening in the left and right direction, and the opening of the first receiving chamber 31 in the left and right direction is convexly provided with a first circular arc plate 32.

The second box body 40 is arranged on one side of the first box body 30 and is mounted on the base 10; the second box body 40 is provided with a second accommodating cavity 41, wherein the second accommodating cavity 41 is provided in the first accommodating cavity 31 and communicates with the first accommodating cavity 31 in the left and right direction so that a first soil-rock space is formed between the second accommodating cavity 41 and the first accommodating cavity 31, and the first soil-rock space is used for storing the first soil-rock, and the first soil-rock in the first soil-rock space forms a fault as the first box body 30 moves relative to the second box body 40.

the second accommodating cavity 41 is convexly provided with a second circular arc plate 42 at the opening in the left and right direction, the second circular arc plate 42 extends arc-shaped in the forward and backward direction; the first circular arc plate 32 is circularly abutted with the second circular arc plate 42 and has a movable gap.

Optionally, the second circular arc plate 42 extends arcuately toward the first box body 30, the circular arc length of the second circular arc plate 42 is greater than the circular arc length of the first circular arc plate 32.

At this time, the first box body 30 is movably mounted on the support arm 20 and moves in a left and right direction to facilitate the movement of the first box body 30 relative to the second box body 40 in the left and right direction, and the first soil-rock in the first soil-rock space forms a left-right direction fault as the first box body 30 moves left and right relative to the second box body 40; the first box body 30 moves forward and backward relative to the second box body 40 as the support arm 20 moves forward and backward relative to the base 10, and the first soil-rock in the first soil-rock space forms a forward-backward direction fault as the first box body 30 moves forward and backward relative to the second box body 40; the first box body 30 moves up and down relative to the second box body 40 as the support arm 20 moves up and down relative to the base 10; the first soil-rock in the first soil-rock space forms up and down direction fault as the first box body 30 moves up and down relative to the second box body 40, so as to form left-right direction faults, forward-backward direction faults and up-down direction faults of the first soil-rock based on the relative movement of the first box body 30 and the second box body 40, so as to be able to simulate the left-right direction faults, forward-backward direction faults and up-down direction faults of the first soil-rock in the soil-rock fault simulation device; the fault simulation effect of soil-rock fault simulation device is improved, and simulations of multiple directional faults are integrated.

Specifically, a second cylinder 53 is connected to the support arm 20, a fixed end of the second cylinder 53 is connected to the base 10, and an output end is connected to the support arm 20, and drives the support arm 20 and the first box body 30 located on the support arm 20 to move in the forward and backward direction, wherein the second cylinder 53 serves as a power source for the support arm 20 to move forward and backward, and drives the support arm 20 to move in the forward and backward direction, and the first box body 30 moves forward and backward as the support arm 20 moves forward and backward.

Therefore, the first box body 30 moves forward and backward under the drive of the support arm 20 and the second cylinder 53, and moves left and right under the drive of the first cylinder 51 and the first linear guide rail 52, so that the first box body 30 moves forward and backward and moves left and right relative to the second box body 40, and during the movement between the first box body 30 and the second box body 40, the first soil-rock in the first soil-rock space forms a corresponding left-right direction fault or forward-backward direction fault with the movement between the first box body 30 and the second box body 40, so as to be able to simulate the left-right direction fault or the forward-backward direction fault of the first soil-rock in the soil-rock fault simulation device, improve the fault simulation effect of the soil-rock fault simulation device, and integrate the simulation of multiple direction faults.

In addition, a third cylinder 54 is connected to the base 10, and the third cylinder 54 is provided at the bottom of the support arm 20; the third cylinder 54 is vertically arranged, and a fixed end of the third cylinder 54 is connected to the base 10, and an output end of the third cylinder 54 abuts the bottom of the support arm 20 and drives the support arm 20 to move up and down relative to the base 10 so that the first box body 30 moves up and down relative to the second box body 40; at this time, the support arm 20 is driven by the third cylinder 54 to move up and down relative to the base 10, so as to facilitate the first box body 30 at the support arm 20 to move up and down relative to the base 10 or the second box body 40, thereby realizing an up-down direction fault of the first soil-rock. Therefore, the soil-rock fault simulation device can simulate the left-right direction fault, the forward-backward direction fault, and the up-down direction fault of the first soil-rock.

In order to realize the up-down direction fault of the first soil-rock, the moving portion 21 is inserted into the moving groove 11 and can move in the forward and backward direction, and at this time, the moving portion 21 is a circular arc part, and the circular arc part is inserted into the circular arc groove and can swing relative to the circular arc groove, and at this time, the up-down direction movement is realized by using the lever principle of the support arm 20 relative to the base 10.

In addition, the soil-rock fault simulation device is further provided with a third box body 60, and the third box body 60 and the second box body 40 are located at the left end and the right end of the support arm 20; the third box body 60 is provided with a third accommodating cavity 61 for accommodating a second soil-rock, and at this time, the third box body 60 and the second box body 40 are located at the left and right ends of the support arm 20, and the swinging state of the support arm 20 is adjusted by increasing or decreasing the second soil-rock located at the third accommodating cavity 61 using the lever principle of the support arm 20 relative to the base 10, and the working pressure of the third cylinder 54 is relieved, the loading amount of the third cylinder 54 is reduced, and the cost of the third cylinder 54 is reduced.

In addition, the soil-rock fault simulation device is further provided with a fourth box body 70, the fourth box body 70 is provided on the base 10 and is provided on one side of the third box body 60, the fourth box body 70 is provided with a fourth accommodating cavity 71, the fourth accommodating cavity 71 communicates with the third accommodating cavity 61 in the left and right direction, and a second soil-rock space is formed between the fourth accommodating cavity 71 and the third accommodating cavity 61, and the second soil-rock space is used for storing the second soil-rock.

At this time, the lever principle of the support arm 20 relative to the base 10 represents the comparative comparison of the up-down direction fault of the first box body 30 relative to the second box body 40 and the up-down direction fault of the third box body 60 relative to the fourth box body 70 and allows the operator to represent the comparative comparison of the up-down direction fault in the same soil-rock fault simulation device, thereby improving the fault simulation effect of the soil-rock fault simulation device.

In addition, the second box body 40 is movably mounted to the base 10, and moves in the forward and backward direction relative to the base 10 as the first box body 30 moves, the second box body 40 moves in a forward and backward direction relative to base 10, and at this time, the second box body 40 serves as a driven box body and is connected to the base 10 by a second linear guide rail 54 arranged in the forward and backward direction.

A soil-rock fault simulation device provided in an embodiment of the present application, wherein a support arm 20 is movably mounted on a base 10 and moves in a forward and backward direction; the first box body 30 is movably mounted on the support arm 20 and moves in a left and right direction; the first box body 30 is provided with a first accommodating cavity 31; the second box body 40 is arranged on one side of the first box body 30 and is mounted on the base 10; the second box body 40 is provided with a second accommodating cavity 41, wherein the second accommodating cavity 41 is provided in the first accommodating cavity 31 and communicates with the first accommodating cavity 31 in the left and right direction, so that a first soil-rock space is formed between the second accommodating cavity 41 and the first accommodating cavity 31, and the first soil-rock space is used for storing the first soil-rock; at this time, the first box body 30 is movably mounted on the support arm 20 and moves in a left and right direction to facilitate the movement of the first box body 30 relative to the second box body 40 in the left and right direction, and the first soil-rock in the first soil-rock space forms a left-right direction fault as the first box body 30 moves left and right relative to the second box body 40; The first box body 30 moves forward and backward relative to the second box body 40 as the support arm 20 moves forward and backward relative to the base 10, and the first soil-rock in the first soil-rock space forms a forward-backward direction fault as the first box body 30 moves forward and backward relative to the second box body 40; the first box body 30 moves up and down relative to the second box body 40 as the support arm 20 moves up and down relative to the base 10; the first soil-rock in the first soil-rock space forms up and down direction fault as the first box body 30 moves up and down relative to the second box body 40, so as to form left-right direction faults, forward-backward direction faults and up-down direction faults of the first soil-rock based on the relative movement of the first box body 30 and the second box body 40, so as to be able to simulate the left-right direction faults, forward-backward direction faults and up-down direction faults of the first soil-rock in the soil-rock fault simulation device; the fault simulation effect of soil-rock fault simulation device is improved, and simulations of multiple directional faults are integrated.

In the above-mentioned embodiments, the description of each embodiment has its own emphasis, and reference can be made to the description of described in detail can be referred to the description of other embodiments.

In the description of the present application, the terms "first" and "second" are used for descriptive purposes only and are not to be understood as indicating or implying relative importance or implicitly indicating the number of technical features indicated. Thus, a feature defined as "first" or "second" may explicitly or implicitly comprise one or more features.

The principles and embodiments of this application present application have been described herein with reference to specific examples, the foregoing description of the examples has been presented only to aid in the understanding of the methods and principles of the present application; at the same time, for a person skilled in the art, according to the idea of the present application, there would be changes in the specific embodiments and the application scope, and in summary, the contents of the present description should not be construed as limiting the present application.

What is claimed is:

1. A soil-rock fault simulation device, comprising:
a base;
a support arm movably mounted to the base and moving in a forward and backward direction;
a first box body movably mounted on the support arm and moving in a left and right direction; the first box body provided with a first accommodating cavity;
a second box body provided on one side of the first box body and mounted on the base; wherein the second box body is provided with a second accommodating cavity, the second accommodating cavity is provided in the first accommodating cavity, and communicated with the first accommodating cavity in a left and right direction so that a first soil-rock space is formed between the second accommodating cavity and the first accommodating cavity, and the first soil-rock space is used for storing the first soil-rock;
the first soil-rock in the first soil-rock space forms a fault as the first box body moves relative to the second box body;
a first cylinder and a first linear guide rail are provided between the first box body and the support arm, the first cylinder and the first linear guide rail are both arranged in a left and right direction, a fixed end of the first linear guide rail is connected to the support arm, and a moving end is connected to the bottom of the first box body; the first cylinder is fixedly connected to the support arm, and an output end is connected to a side wall of the first box body;
the base is provided with a moving groove, and the moving groove extends in a forward and backward direction; the lower side wall of the support arm is provided with a moving portion, and the moving portion is inserted into the moving groove and can move in the forward and backward direction;
a second cylinder is connected to the support arm, a fixed end of the second cylinder is connected to the base, and an output end is connected to the support arm, and drives the support arm and the first box body on the support arm to move in a forward and backward direction;
the moving groove is a circular arc groove, and the opening of the moving groove extends upwards; the moving portion is a circular arc portion that is inserted into the circular arc groove and can swing relative to the circular arc groove;
the base is connected to a third cylinder, and the third cylinder is arranged at the bottom of the support arm;
the third cylinder is arranged vertically, a fixed end of the third cylinder is connected to the base, and an output end of the third cylinder abuts the bottom of the support arm and drives the support arm to move in an up and down direction relative to the base so that the first box body moves in an up and down direction relative to the second box body.

2. The soil-rock fault simulation device of claim 1, wherein the soil-rock fault simulation device is further provided with a third box body, the third box body and the second box body are located at the left end and the right end of the support arm; the third box body is provided with a third accommodating cavity, and the third accommodating cavity is used for accommodating a second soil-rock.

3. The soil-rock fault simulation device of claim 2, wherein the soil-rock fault simulation device is further provided with a fourth box body, the fourth box body is provided at the base and one side of the third box body, the fourth box body is provided with a fourth accommodating cavity, the fourth accommodating cavity communicating with the third accommodating cavity in the left and right direction and forms a second soil-rock space with the third accommodating cavity, the second soil-rock space is used for storing the second soil-rock.

4. The soil-rock fault simulation device of claim 1, wherein the second accommodating cavity is convexly provided with a second circular arc plate at the opening in the left and right direction, the second circular arc plate extends arc-shaped in the forward and backward direction; and the first accommodating cavity is convexly provided with a first circular arc plate at the opening in the left and right direction, and the first circular arc plate and the second circular arc plate are in circular abutment and have a movable gap.

5. The soil-rock fault simulation device of claim 4, wherein the second circular arc plate extends arcuately towards the first box body, the length of the circular arc of the second circular arc plate is greater than the length of the circular arc of the first circular arc plate.

6. The soil-rock fault simulation device of claim 1, wherein the second box body is movably mounted to the base and moves relative to the base as the first box body moves, the second box body moves in a forward and backward direction relative to the base.

\* \* \* \* \*